(12) United States Patent
Li et al.

(10) Patent No.: US 12,575,377 B2
(45) Date of Patent: Mar. 10, 2026

(54) METHOD AND TOOL FOR RESTRICTING SUBSTRATE A SUPPORT BEAD INSIDE AN OPENING FORMED IN A SUBSTRATE SUPPORT

(71) Applicant: Applied Materials, Inc., Santa Clara, CA (US)

(72) Inventors: Liurui Li, Santa Clara, CA (US); Songjae Lee, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 424 days.

(21) Appl. No.: 18/116,244

(22) Filed: Mar. 1, 2023

(65) Prior Publication Data

US 2024/0297066 A1 Sep. 5, 2024

(51) Int. Cl.
| | |
|---|---|
| *H01L 21/68* | (2006.01) |
| *B65G 47/90* | (2006.01) |
| *H01L 21/687* | (2006.01) |

(52) U.S. Cl.
CPC .......... *H01L 21/6875* (2013.01); *B65G 47/90* (2013.01); *H01L 21/68707* (2013.01)

(58) Field of Classification Search
CPC ........... H01L 21/6875; H01L 21/68707; H01L 21/68735; H01L 21/68742
See application file for complete search history.

(56) References Cited

U.S. PATENT DOCUMENTS

| | | | | |
|---|---|---|---|---|
| 3,052,462 A | * | 9/1962 | Butler | B25B 5/163 |
| | | | | 269/258 |
| 5,796,555 A | * | 8/1998 | Aoyagi | G11B 5/4833 |
| | | | | 360/244.6 |
| 5,854,721 A | * | 12/1998 | Lim | G11B 5/4833 |
| | | | | 360/99.18 |
| 6,226,152 B1 | * | 5/2001 | Tanaka | G11B 21/02 |
| 6,417,994 B1 | * | 7/2002 | Yim | G11B 21/16 |
| 6,917,755 B2 | * | 7/2005 | Nguyen | C23C 16/4581 |
| | | | | 414/217 |
| 9,443,752 B2 | * | 9/2016 | Brodine | H01L 21/67742 |
| 2003/0072639 A1 | * | 4/2003 | White | H01L 21/67309 |
| | | | | 414/217 |
| 2004/0141670 A1 | * | 7/2004 | Gotoh | F16C 33/416 |
| | | | | 384/523 |

* cited by examiner

*Primary Examiner* — Bayan Salone
(74) *Attorney, Agent, or Firm* — Patterson + Sheridan, LLP

(57) ABSTRACT

A method for securing a support ball in a substrate support, a tool for forming a capture lip in a substrate support, and a substrate support having a substrate support ball captured in an opening of the substrate support are provided. In one example, a method for securing a support ball in a substrate support includes pressing a support ball into an opening formed in a first surface of the substrate support which is configured to support a substrate in a vacuum processing chamber, forming a capture lip in the opening which protrudes into the opening a distance sufficient to retain the support ball in the opening support ball, and setting an exposure height that the support ball projects above the first surface the substrate support.

9 Claims, 7 Drawing Sheets

100

102

INSERTING A SUPPORT BALL IN
CAVITY OF A SUBSTRATE SUPPORT

104

FORMING A CAPTURE LIP TO
RETAIN THE SUPPORT BALL IN
THE SUBSTRATE SUPPORT

106

SETTING AN EXPOSURE HEIGHT OF
SUPORT BALL

METHOD AND TOOL FOR RESTRICTING SUBSTRATE A SUPPORT BEAD INSIDE AN OPENING FORMED IN A SUBSTRATE SUPPORT

BACKGROUND

Field

Embodiments of the disclosure relate to a method for setting and securing a support bead in a substrate support and an apparatus for performing the same.

Description of the Related Art

In vacuum processing chambers for substrates, contamination is a factor in determining yield. Contaminants on substrates can cause defects in the devices formed during processing. Substrate defects reduce production yield, undesirably increasing the cost to manufacture and ultimately, the cost of the finished product. Thus, minimizing contamination is important driver for maintaining satisfactory production yield. The vacuum processing chamber and the components therein can often be a source of contamination. Contamination of the vacuum processing chamber can cause particles to fall onto the substrate during processing or handling, and such particles may result in defects of the devices formed on the substrate during processing.

To minimize particle generation and substrate scratching during handling of the substrate, substrate handling devices are designed to minimize the surface area contact of the device with the substrate. Substrate handling devices often utilize a dimple or ball to support the substrate thereon to minimize contact with the substrate. Occasionally, the support balls may become dislodged from the substrate support device, allowing the substrate to come into direct contact with underlying portions of the substrate support device, which can cause scratches, damage and particulate contamination of the substrate. Additionally, when the support balls become dislodged from the substrate support device, the support balls fall into the bottom of the vacuum processing chamber causing additional particle generation and potentially damaging expensive pumping components requiring a shutdown of the entire system for maintenance. Accordingly, preventing the support balls from becoming dislodged from the substrate support devices is desired.

Therefore, there is a need for an improved substrate handling device and methods for manufacturing the same.

SUMMARY

A method for securing a support ball in a substrate support, a tool for forming a capture lip in a substrate support, and a substrate support having a substrate support ball captured in an opening of the substrate support are provided. In one example, a method for securing a support ball in a substrate support includes pressing a support ball into an opening formed in a first surface of the substrate support which is configured to support a substrate in a vacuum processing chamber, forming a capture lip in the opening which protrudes into the opening a distance sufficient to retain the support ball in the opening support ball, and setting an exposure height that the support ball projects above the first surface the substrate support.

In another example, a method for securing a support ball in a substrate support configured to support a substrate in a vacuum processing chamber that includes pressing the support ball into an opening to a first depth, forming a capture lip in the opening, and setting the exposure height of the support ball. The opening is formed in a first surface of the substrate support. After forming the capture lip in the opening, the capture lip protrudes into the opening a distance sufficient to retain the support ball in the opening. The capture lip is formed between the first surface and a portion of the support ball in contact with the substrate support. The capture lip and the support ball are disposed in a spaced apart relationship once the capture lip is formed. The exposure height is set by pressing the support ball to a second depth within the opening that is greater than the first depth such that a bottom of the opening and the support ball disposed in the opening are spaced apart once the exposure height is set.

In yet another example, a tool for forming a capture lip in a substrate support includes a cylindrical body having a first end and a hollow second end. The hollow tip includes a cylindrical recess formed along a centerline of the body and an inner side and an outer side that forms a point that circumscribes the recess. The inner side and outer side form are oriented at different angles relative to the centerline of the body.

In another example, a substrate support includes an opening formed in the top surface of a body and a ball is disposed in the opening using the method described herein.

In still another example, a substrate support apparatus for supporting a substrate in a vacuum processing chamber is provided. The substrate support apparatus includes a first body fabricated from a rigid material, at least a first opening formed in a top surface of the first body, a capture lip extending into the first opening, and a first support ball disposed in the first opening. The first support ball extends partially above the top surface of the first body. The first support ball is spaced apart from the capture lip.

BRIEF DESCRIPTION OF DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Described herein is a method for setting a support ball in a substrate support and the tools used to set the support ball. Also described herein are substrate supports having support balls captured therein. The method for setting a support ball in a substrate support includes roughly positioning the support ball inside of an opening, such as a hole, formed in the substrate support, forming a capture lip in the substrate support by deforming the material of the substrate support around the edge of the opening to capture the support ball within the opening, thus preventing the support ball from disengaging from the substrate support during use. This method advantageously extends the service life of the substrate support, enables substrate supports to be fabricated without the need for manufacturing additional components, and reduces the probability of particle generation, which beneficially reduces processing downtime for cleaning and decontamination. The methods described herein also beneficially increase substrate processing yield and extends the service time between cleans and component replacement. Thus, the methods disclosed herein reduce the cost of ownership and increase the efficiency of a vacuum processing chamber in which the novel substrate supports described herein are utilized.

In one example, the method disclosed herein utilizes a ring punch tool that is configured to precisely form a capture lip at the mouth of an opening formed in the substrate support that retains the support ball within the opening without contacting the support ball. The ring punch tool beneficially reduces the possibility of damage to the support ball, which might later become a source of substrate scratching, and allows for proper placement of the support ball in the opening so that a portion of the support ball reliably projects a desired distance above the substrate support to ensure no substrate to substrate support contact during use.

Figure 1:
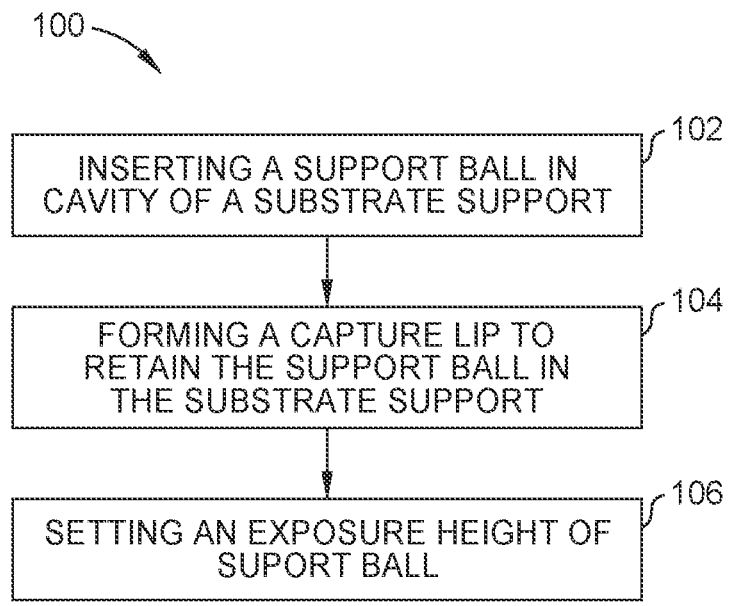
FIG. 1 is a flow diagram of a method for setting a support ball in a substrate support, according to one embodiment.
Figures 2A, 2B, 2C:
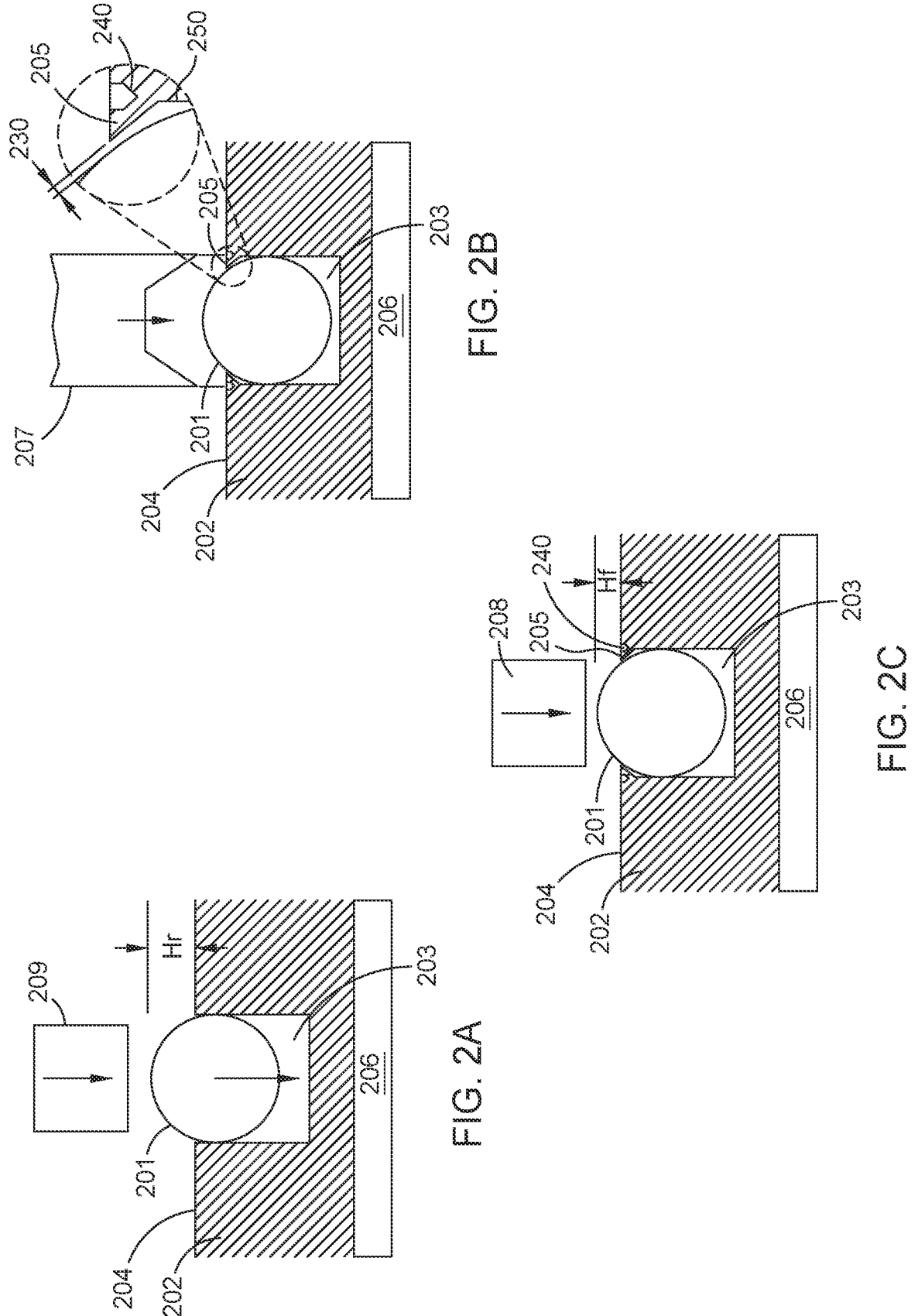
FIGS. 2A-2C are partial cross-sectioned views of the support ball and substrate support during different stages of the ball insertion process, according to one embodiment.

Turning now to FIG. 1, FIG. 1 illustrates a flow diagram of a method 100 for setting a support ball in a substrate support, according to one embodiment. FIGS. 2A-2C are partial cross-sectioned views of the support ball and substrate support during different stages of the ball insertion process corresponding to the method 100 of FIG. 1. Although the method 100 is described in conjunction with the illustrations of FIGS. 2A-2C, persons skilled in the art will understand that the method 100 may be utilized to form other substrate supports or other components where the distance of a ball projecting securely from the component is desired. The method 100 can be used to fabricate many different types of substrate supports, such as those for use in vacuum processing chambers. Some non-limiting examples of substrate supports include a lift finger, a robot blade, or any other component configured to support a substrate of other workpiece in a vacuum processing chamber.

The method 100 begins at operation 102 by inserting a support ball 201 into an opening 203 formed in a body 210 of a substrate support 202. In one example, the opening 203 is a hole formed in the substrate support 202 by drilling, milling or other suitable technique. The opening 203 formed in the substrate support 202 is sized to receive the support ball 201. The opening 203 may be configured as a vented hole to allow the support ball 201 to be loose fit, slip fit, press fit or otherwise disposed in the hole. The support ball 201 is be pressed into the opening 203 by a pressing tool 209. In an embodiment shown in FIG. 2A the pressing tool 209 is a bench press. In other embodiments the support ball 201 can be pressed into the opening 203 by a hydraulic press, by hand, or any other tool configured to apply pressure. At operation 102 the support ball 201 is pressed roughly into position in the opening 203 such at least a portion of the support ball 201 extends above a top surface 204 of the substrate support 202 in which the opening 203 is formed. The support ball 201 is pressed to a depth in the opening 203 that is at least deep enough to perform operation 104. The height at which the support ball 201 protrudes above the top surface 204 of the substrate support 202 is illustrated as exposure height Hr. The exposure height Hr of the support ball 201 above the top surface 204 after the rough press is greater than an exposure height Hf of the support ball 201 above the top surface 204 after the final press later describe below at operation 106. In other embodiments the exposure height Hr of the rough press of the support ball 201 may be equal to the final exposure height Hf of the support ball 201 in the opening 203 of operation 106.

The support ball 201 is generally made of either metallic or non-metallic materials. In one embodiment the support ball 201 is made of silicon nitride (SiN). In alternative embodiments, the support ball 201 can be made from ceramic, glass, sapphire, quartz, or a metal or metal alloy. In other embodiments the support ball 201 can be coated or plated. The material of the support ball 201 can depend upon the substrate to be processed. The material comprising the support ball 201 should be chosen to minimize contamination or damage to the substrate and be compatible with desired semiconductor processing conditions. The support ball 201 shown in FIGS. 2A-2C is a sphere. In some embodiments the support ball 201 can be bullet-shaped, elliptical or have another suitable shape. The curved exposed surface of the support ball 201 that extends beyond the top surface 204 of the substrate support 202 provides a single point of contact with the substrate.

In some examples, the opening 203 formed in the substrate support 202 is a blind hole, which may be vented. In alternative examples, the opening 203 can be a through hole or a vented hole. The diameter of the opening 203 may be less than or equal to a diameter of the support ball 201.

At operation 104, the top surface 204 of the substrate support 202 is deformed along the edge of the opening 203, as depicted in FIG. 2B. The deformed material of the substrate support 202 is displaced into the opening 203 to create a capture lip 205 at the opening of the opening 203 using a deformation tool 207. The deformation tool 207 forms an indent 240 on the top surface 204 of the substrate support 202 that displaces material of the substrate support 202 into the opening 203 to form the capture lip 205 inward of the sidewall 250 of the opening 203. The indent 240 may be a single dimple, a plurality of dimples, a ring or having another shape.

The capture lip 205 generally remains spaced a distance 230 from the support ball 201 such that formation of the capture lip 205 does not damage the ball 201. The substrate support 202 may be held in place during operation 104 by a fixture 206 configured to receive at least a portion of the substrate support 202. In some embodiments the substrate support fixture 206 is specifically designed pursuant to dimensions of the substrate support 202 such that at least a portion of the substrate support 202 is flush with the portion of the fixture 206 configured to secure the substrate support 202. In alternative embodiments the substrate support 202 can be held in place by hand or affixed by a clamp or other another securing mechanism. The top surface 204 along the circumference of the opening 203 of the substrate support 202 is deformed by the deformation tool 207, and is displaced into the opening 203 to form the capture lip 205. In one example, the deformation tool 207 is configured to press the material of the substrate support 202 around the opening 203 inwards toward the opening of the opening 203 without the tool 207 contacting the support ball 201. The deformation tool 207 may be affixed to an actuator (such as the actuator 305 of an insertion tool 300 shown in FIG. 3) configured to move the 207 tool in a direction perpendicular to the top surface 204 of the substrate support 202. In some embodiments the deformation tool 207 is configured to deform the substrate support 202 at one point adjacent the opening of the opening 203. In alternative embodiments the deformation tool 207 is configured to deform the substrate support 202 at a plurality of points around the opening of the opening 203. In another embodiment, the deformation tool 207 is configured to imprint a ring shape in the top surface 204 of the substrate support 202 to form the capture lip 205 in a ring-shape around the edge of the opening 203. The deformation tool 207 can be a ring punch affixed to a press. In alternative embodiments the substrate support 202 can be deformed by any conventional method, such as by hand tool, punch, or by another device suitable for deforming the material of the substrate support 202 in a manner that captures the support ball 201 in the opening 203.

At operation 106, as shown in FIG. 2C, the support ball 201 is set to the final position in the opening 203 of the substrate support 202. The support ball 201 is set to the final position by pushing the ball 201 from the rough exposure height Hr in the opening 203 to a final exposure height Hf above the top surface 204 of the substrate support 202. In some embodiments, the final exposure height Hf is between 0.01 and 0.1 inches.

Figure 3:
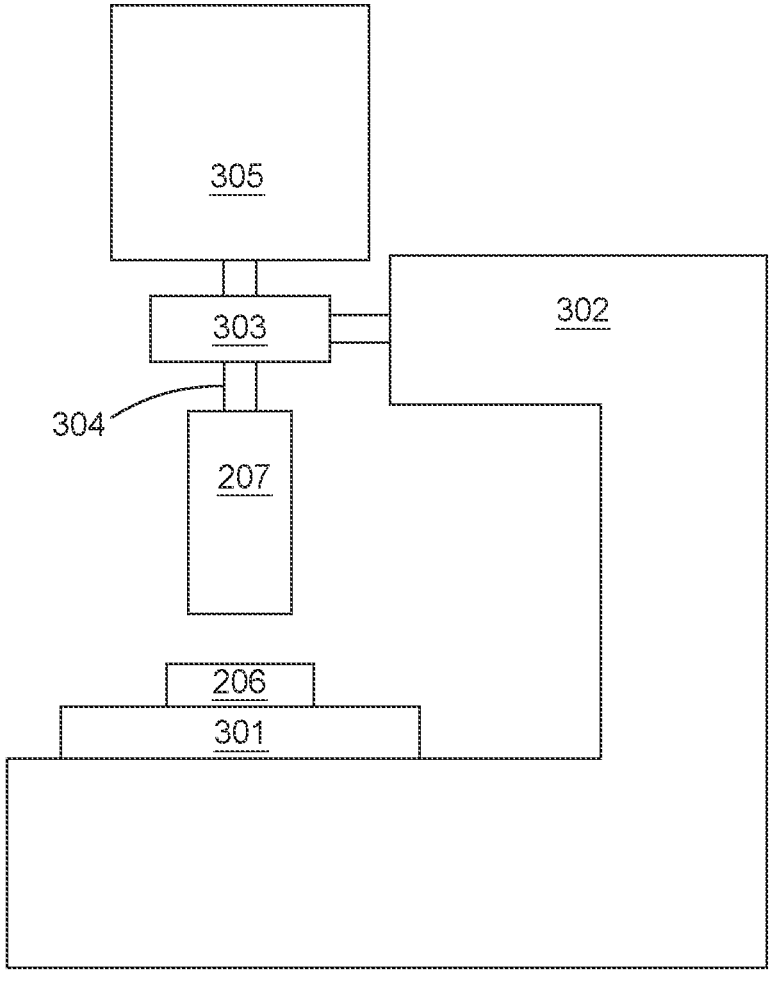
FIG. 3 is a schematic view of an insertion tool that can be used to perform the ball setting method described with reference to FIG. 1, according to one embodiment.

FIG. 3 is a schematic view of an embodiment of an insertion tool 300 that is suitable to perform the method 100 described above. As shown, the insertion tool 300 includes a platen 301, a body 302, an arm 303 that supports a bit holder 304 and an actuator 305. The fixture 206 used to hold the substrate support 202 during the method 100 is affixed to the platen 301. The bit holder 304 is used for securing tools used to insert the support ball 201 in the opening 203 of the substrate support 202, such as the deformation tool 207. The bit holder 304 is connected to the actuator 305. The actuator 305 is operable to move the bit holder 304 in a direction perpendicular to the top surface of the platen 301, i.e., toward and away from the fixture 206. The bit holder 304 is configured to hold the insertion tools, for example, using a collet. In the embodiment shown, the deformation tool 207 is connected to the bit holder 304. The insertion tool 300 shown in FIG. 3 is configured to perform each of the operations 102, 104, and 106 of the method 100 described above. Alternatively, one or more of the operations 102, 104, and 106 can be performed using other suitable tools.

Figures 4A, 4B, 5:
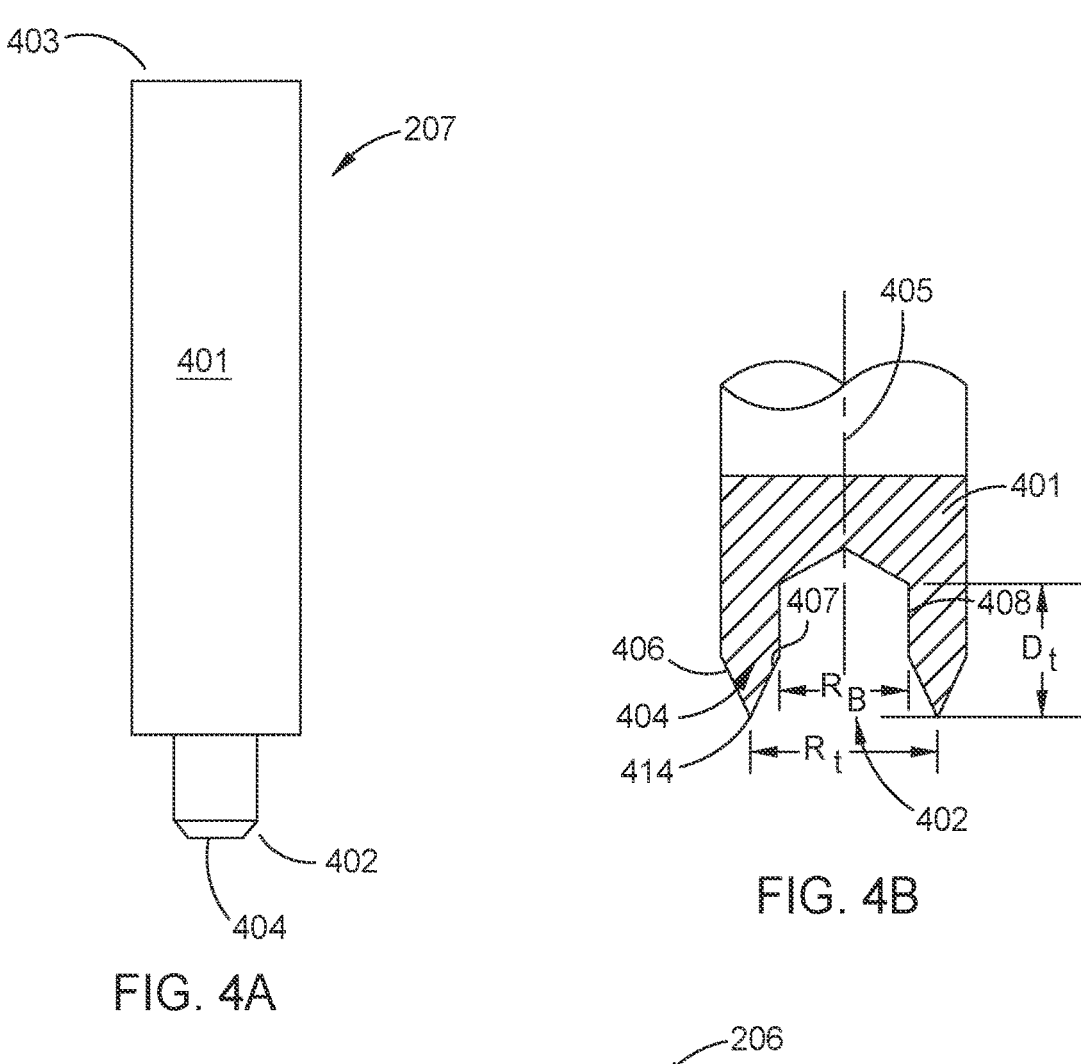
FIG. 4A is a front view of a deformation tool used to perform the ball setting method described with reference to FIG. 1, according to one embodiment.
FIG. 4B is a partial sectional view of a portion of the deformation tool of FIG. 4A, according to one embodiment.
FIG. 5 a top view of one example of a substrate support fixture, according to one embodiment.

FIG. 4A is a front view of one example of the deformation tool 207 that used to perform the ball setting method 100 described with reference to FIG. 1, according to one embodiment. FIG. 4B is a partial sectional view of a portion of the deformation tool 207 of FIG. 4A. The deformation tool 207 is configured to displace the material of the substrate support 202 to create the capture lip 205 without contacting to the support ball 201. As shown, the deformation tool 207 has a solid cylindrical body 401 that terminates at a first end 402 that is configured to deform the substrate support 202. The deformation tool 207 also has a second end 403 configured to attach to the bit holder 304 of the insertion tool 300. The first end 402 includes a hollow tip 404. The hollow tip 404 includes a cylindrical recess 408 that extends into the body 401 in a direction toward the second end 403. The hollow tip 404 forms a point 414 which has a diameter Rt that is larger than a diameter of the opening 203 formed in the substrate support 202. A depth Dt of the cylindrical portion of the recess 408 of the hollow tip 404 is at least equal to or great than the rough exposure height Hr of the support ball 201 after the rough press. In some embodiments the recess 408 of the hollow tip 404 is deeper than the exposed height Hr of the support ball 201 at the exposure height Hr after the rough press so that the ball 201 does not contact the tool 207 during formation of the capture lip 205. In an alternate embodiment, the recess 408 of the hollow tip 404 has a depth Dt equal to the desired exposure height Hf of the support ball 201 after the final press. In some embodiments the recess 408 of the hollow tip 404 can be cylindrical with an inner diameter Rb. The inner diameter Rb is greater than a diameter of the support ball 201. The point 414 of the deformation tool 207 that surrounds the recess 408 is configured to deform the top surface 204 of the substrate support 202 and displace the material of the substrate support 202 in a direction inwards toward the interior opening 203 (i.e., in a radially inward direction), thus forming the capture lip 205. In some embodiments, the point 414 of the hollow tip 404 has asymmetrical sides to direct the displaced the material of the substrate support 202 towards the opening 203. In some embodiments, the point 414 of the hollow tip 404 has a diameter Rt of between 0.5 and 2.0 inches. In other embodiments, the diameter Rt of the point 414 is between 1 and 1.5 inches, such as 1.375 inches. In an embodiment, the point 414 of the hollow tip 404 has an outer side 406 having an angle of less than 45 degrees with respect to an axial center line 405 of the body 401, such as 31 degrees, and an inner side 407 having an angle of less than 20 degrees with respect to the axial center line 405 of the body 401, such as 18 degrees.

The deformation tool 207 is made of a material with a hardness sufficient to deform the substrate support 202. In some embodiments the deformation tool 207 is made from hardened tool steel or other suitable material.

FIG. 5 is a top view of a fixture 206 suitable for securing one example of the substrate support 202 while forming the capture lip 205 on the opening 203 as discussed above. The fixture 206 is comprised of a base body 501 and a slot 502. The slot 502 has a shape selected to allow the portion of the substrate support 202 containing the opening 203 to be inserted therein. The slot 502 securely receives the substrate support 202 in an orientation that exposes the opening 203 to the tool secured by the bit holder 304. Stated differently, the slot 502 has a shape that nests with, or is complimentary to, a shape of the substrate support 202. The slot 502 further comprises a landing 503 configured to securely support the substrate support 202 in an orientation perpendicular to the axial centerline of the deformation tool 207 secured in the tool bit holder 304 such that the top surface 204 of the substrate support 202 is maintained parallel with the top plane of the fixture 206. The fixture 206 may also have a second slot or slots (not shown) on one or more sides configured to secure other portions of the substrate support 202.

Figure 6:
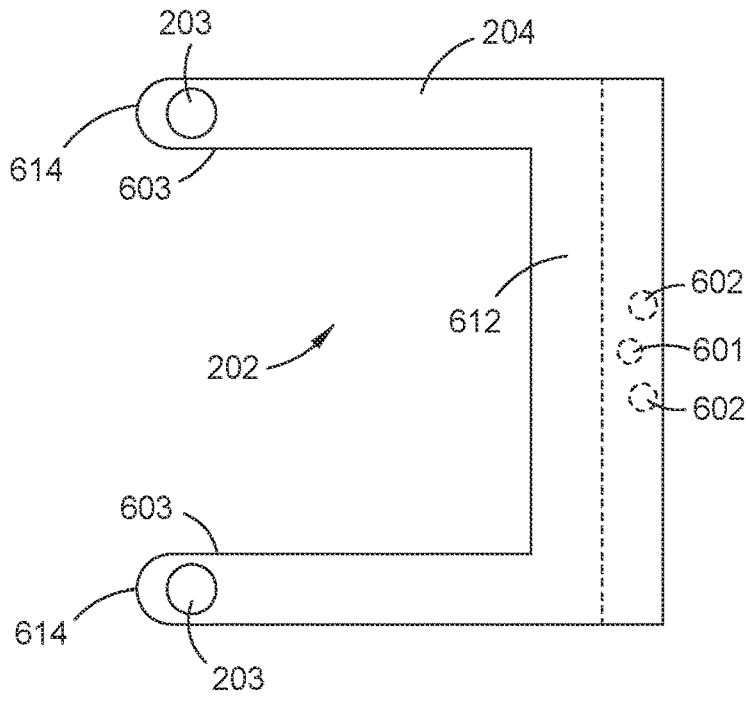
FIG. 6 is a top plan view of one example of a substrate support lift finger with a support ball disposed in the substrate support, according to one embodiment.

FIG. 6 illustrates a top view of one example of a portion of a substrate support 202. The substrate support 202 may, for example, include a lift finger. In another embodiment, the substrate support 202 may be a robot blade. The substrate support 202 has a flat top surface 204. One or more threaded holes 601 and/or locating holes 602 may be formed in a wrist portion 612 of the substrate support 202. The holes 601, 602 are configured to attach the substrate support 202 to another component in a vacuum processing system, such as a lift plate or actuator. In the example depicted in FIG. 6, two locating holes 602 are disposed to either side of a threaded hole 601. The threaded hole 601 is generally formed on a centerline that bifurcates the substrate support 202. The substrate support 202 may be formed from a metal or other suitable material. In one example, the substrate support 202 is formed from stainless steel or aluminum. In other embodiments, the substrate support 202 may be fabricated from ceramic, glass reinforced plastic, or metal alloy, or a stiff material coated with a ceramic, metal, or metal alloy. The substrate support 202 shown in FIG. 6 comprises two substrate support fingers 603, each substrate support finger 603 extending from the wrist portion 612 and terminating at a distal end 614. Each lift finger 603 is symmetrically disposed on either side of the centerline that bifurcates the substrate support 202. Each opening 203 has a support ball 201 disposed therein that extends the distance Hf above the top surface 204. The opening 203 is form in the top surface 204 of the substrate support 202 proximate the distal end 614 of each substrate support finger 603.

Figure 7:
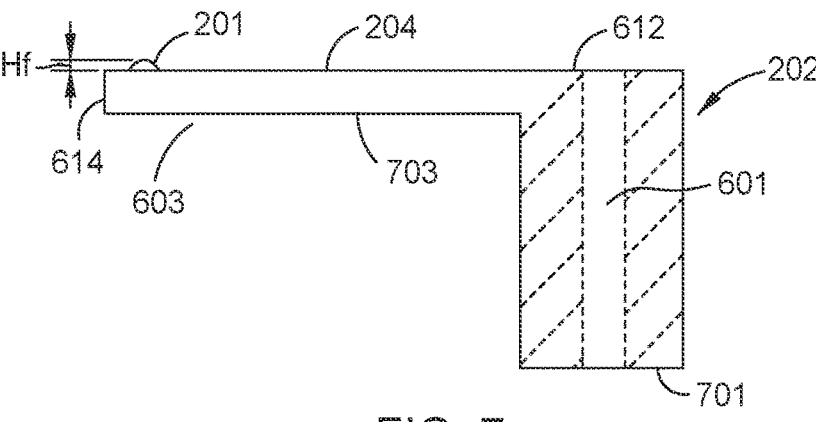
FIG. 7 is a side view of the substrate support lift finger illustrated in FIG. 6.

FIG. 7 is a cross sectional view of one embodiment of the substrate support lift finger 603 having the substrate support ball 201 projecting above the top surface 204 of the support finger 603. As discussed above, the support ball 201 has an exposure height Hf protruding above the top surface 204 of the substrate support 202. The wrist 612 of the substrate support 202 extends from the top surface 204 to a lower surface 701 that is located below the bottom surface 703 of the lift finger 603. As such, the lift fingers 603 extend from the wrist 612 in a cantilevered manner. Optionally, the threaded hole 601 (and/or the locating holes 602) may extend completely through the wrist 612 between the top and bottom surfaces 204, 701.

Figure 8:
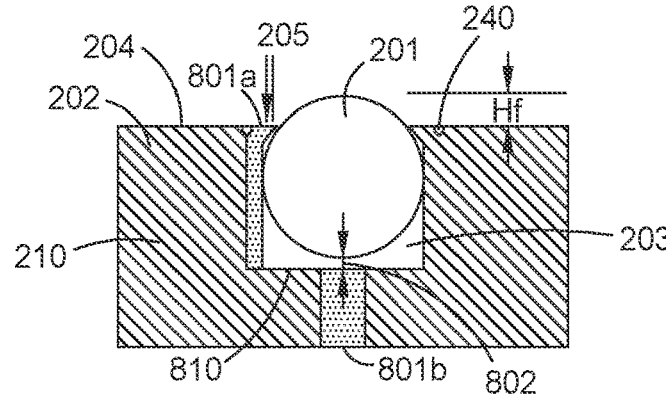
FIG. 8 is a partial sectional view of a partial of the substrate support lift finger of FIG. 6 illustrating a support ball disposed in an opening of the substrate support.

FIG. 8 illustrates an enlarged sectional view of a portion of the distal end 614 of the lift finger 603 illustrating the support ball 201 pressed inside the opening 203. The opening 203 can be a blind hole, a through hole, a stepped blind hole, a vented hole, or any other opening configured to receive the support ball 201. The opening 203 may also be stepped with a first portion having diameter and depth extending from the top surface 204 of the substrate support 202 configured to allow the ball 201 to be disposed therein, and second portion with a smaller diameter extending from the bottom of the first portion to allow venting while preventing the ball 201 from passing therethrough. The opening 203 may also have a vent 801a which interfaces with the side of the opening 203, allowing gas to pass around the support ball 201 when a support ball 201 is pressed into the opening 203. The vent 801a prevents gas from being trapped below the support ball 201 within the opening 203 which could create a force pushing the ball 201 out of the opening 203 when the substrate support 202 is subjected to vacuum conditions The vent 801a may be a hole interesting the opening 203, or a notch or groove formed in the sidewall of the opening 203. The vent 801a can have a depth equal to the full depth of the opening 203. Alternatively, the vent 801a can have a depth greater than the distance Hf plus the diameter of the support ball 201. Alternatively, the opening 203 can be vented through a bottom 810 of the opening 203, such as a hole 801b.

Also illustrated in FIG. 8 is a space 802 defined between the support ball 201 and the bottom 810 of the opening 203 after the ball 201 set to the final position such that the ball 201 extends to a height Hf above the top surface 204 of the substrate support 202. The space 802 ensures that the ball 201 is not damaged upon insertion to the final position. As shown, the support ball 201 is also spaced apart from the capture lip 205 (as shown by distance 230 illustrated in FIG. 2B).

Figure 9:
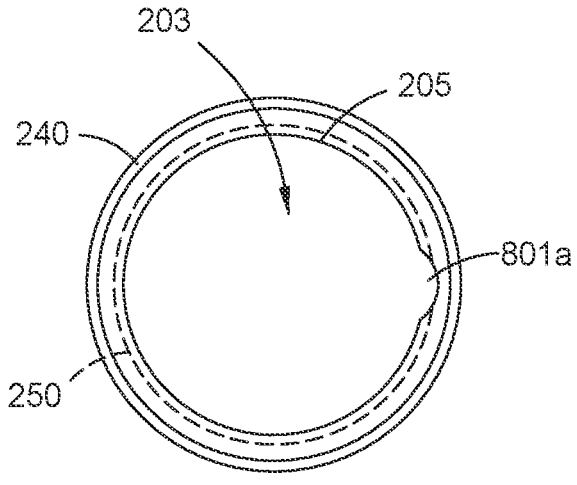
FIG. 9 is an enlarged partial top view of the support ball disposed in the opening of the substrate support lift finger illustrated in FIG. 6.

FIG. 9 exhibits an enlarged top view of an embodiment of the vent 801a. The support ball 201 is not illustrated in FIG. 9. The vent 801 intersects a sidewall 901 of the opening 203 (rather than a bottom vent, as also disclosed). The vent 801a may have any suitable geometry, and in the example depicted in FIG. 9, the vent 801a is a portion of a hole formed in the top surface 204 of the substrate support 202. As discussed above, the function of the vent 801a is to fluidly connect the area underneath the support ball 201 in the opening 203 with the environment outside of the opening 203 to prevent a pressure differential across the ball 201 which might urge the ball 201 out of the opening 203. The vent 801a can be alternatively configured to vent the opening 203 in a vacuum chamber.

Figure 10:
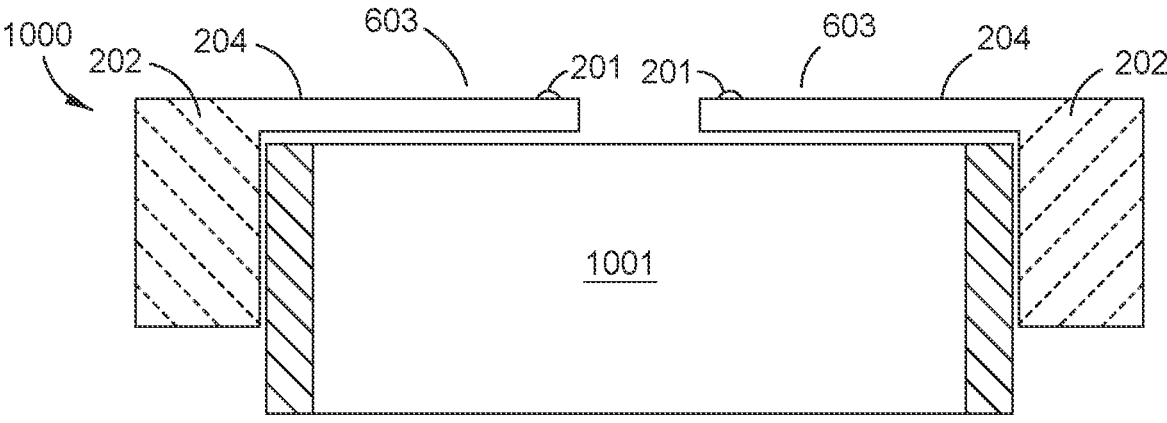
FIG. 10 is a cross sectional view of a lift assembly that includes a lift ring having multiple substrate support lift fingers attached thereto, according to one embodiment.

FIG. 10 is a cross sectional view of a lift assembly 1000 that includes a lift ring 1001 having at least one substrate support 202 attached thereto. In the example depicted in FIG. 10, the lift ring 1001 of the lift assembly 1000 includes multiple substrate supports 202. Each substrate support 202 includes multiple lift fingers 603. As shown, each substrate support 202 has two lift fingers 603. Each lift finger 603 has a support ball 201 disposed in an opening 203 as discussed above. The support balls 201 protrude to an exposure height Hf above the top surface 204 of the substrate support 202. In the embodiment shown, the substrate supports 202 are affixed to opposite ends of the lift ring 1001, for example by using the holes 601, 602 formed in the substrate supports 202. Although two substrate supports 202 are shown in FIG. 10, the lift ring 1001 can include any number of substrate supports 202 arranged at intervals spaced around the lift ring 1001. According to some embodiments each substrate support 202 can have one or more support ball 201 disposed therein.

Figures 11, 12A, 12B:
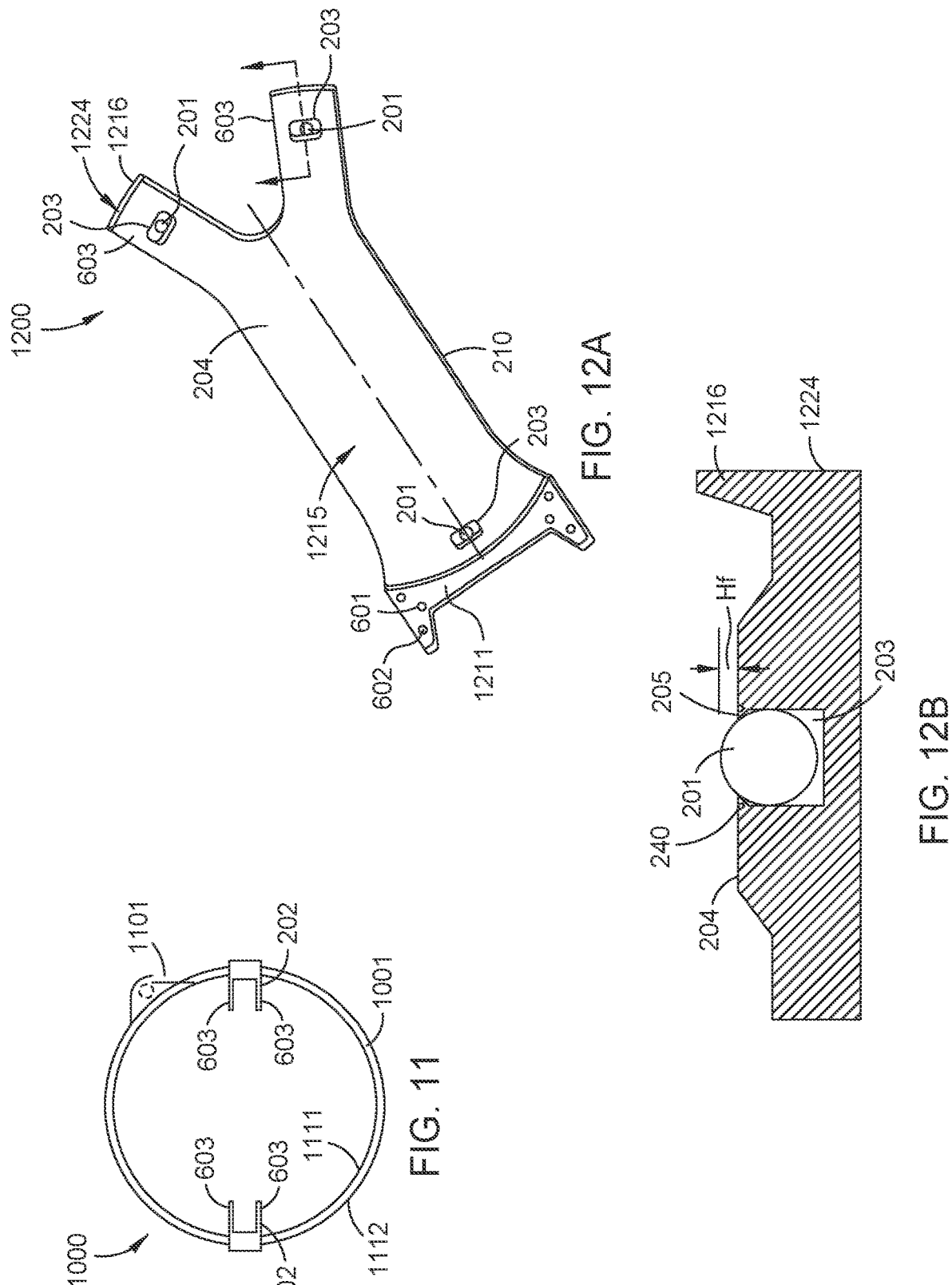
FIG. 11 is a top view of the lift assembly of FIG. 10.
FIG. 12A is an isometric view of a substrate support configured as a robot blade.
FIG. 12B is a partial sectional view of the substrate support of FIG. 12A illustrating a support ball disposed in an opening of the substrate support.

FIG. 11 illustrates a top view of a segment of the lift assembly 1000. The lift ring 1001 of the lift assembly 1000 including two substrate supports 202 disposed 180 degrees apart. Each substrate support 202 includes with two lift fingers 603 that extend over a top surface of the lift ring 1001 and inward of an inner diameter 1111 of the lift ring 1001. The lift ring 1001 also includes a mounting flange 1101 disposed on an outer diameter 1112 to connect the lift assembly 1000 to an actuator of the vacuum processing chamber so that the lift assembly 1000 may be utilized to raise and lower a substrate disposed on the support balls 201 of the substrate supports 202.

FIGS. 12A-12B schematically illustrate a substrate support 1200 in accordance with another embodiment of the present invention. The body 210 of the substrate support 1200 is configured as robot blade. The body 210 of the substrate support 1200 has a distal end 1224 and a wrist 1211. The wrist 1211 is configured for mounting the substrate support 1200 to a substrate handling robot (not shown). The wrist 1211 includes one or more holes 601, 602 to facility mounting. The distal end 1224 includes a plurality of openings 203, each opening 203 including a support ball 201 extending a distance Hf above the top surface 204 of the substrate support 1200. The distal end 1224 may include one or more lift fingers 603. At least one support ball 201 is disposed proximate the wrist 1211 for supporting the substrate in conjunction with the other balls 201 disposed at the distal end 1224. While 3 support balls 201 are illustrated in FIG. 12, additional support balls 201 may be utilized.

The distal end 1224 and the wrist 1211 may optionally have fingers 1216 extending upward from the top surface 204 to form a substrate receiving pocket 1215. The support balls 201 extend above the top surface 204 to support the substrate within the substrate receiving pocket 1215 while the fingers 1216 prevent the substrate from slipping off of the substrate support 1200 while the substrate support 1200 is in motion.

The substrate support described above may be expressed in the following, non-limiting examples.

Example 1: A substrate support apparatus for supporting a substrate in a vacuum processing chamber is provided that includes: a first body fabricated from a rigid material, the first body having a top surface and a bottom surface; at least a first opening formed in the top surface of the first body; a capture lip extending into the first opening; and a first support ball disposed in the first opening and partially extending above the top surface, the first support ball spaced apart from the capture lip.

Example 2. The substrate support apparatus of Example 1, wherein the first body is fabricated from at least one of stainless steel and aluminum.

Example 3. The substrate support apparatus of Example 1, wherein the first support ball is spaced apart from a bottom of the first opening.

Example 4. The substrate support apparatus of Example 1, wherein a portion of the first opening below the first support ball is vented.

Example 5. The substrate support apparatus of Example 4, wherein a portion of the first opening below the first support ball is vented through the bottom surface of the first body.

Example 6. The substrate support apparatus of Example 1, wherein the first body further comprises a vent formed through the captured lip that is fluidly coupled to a portion of the first opening disposed below the first support ball.

Example 7. The substrate support apparatus of Example 1, wherein the first body further comprises a first wrist having at least one mounting hole; and at least a first finger extending from the first wrist to a distal end, the distal end of the first finger having the first support ball disposed therein.

Example 8. The substrate support apparatus of Example 7, wherein the first body further comprises: at least a second finger extending from the first wrist to a distal end, the distal end of the second finger having a second support ball disposed therein, the second support ball extending partially above the top surface of the first body.

Example 9. The substrate support apparatus of Example 8 further comprising a ring having the first wrist coupled thereto, the distal ends of the first and second fingers extending inward of an inner diameter of the ring.

Example 10. The substrate support apparatus of Example 9 further comprising a second body fabricated from a rigid material, the second body having a top surface and a bottom surface, the second body comprising: a second wrist coupled to the ring; a third finger extending from the second wrist, the third finger extending inward of the inner diameter of the ring; and a fourth finger extending from the second wrist, the fourth finger extending inward of the inner diameter of the ring; a third support ball retained in the third finger by a capture ring that is spaced from the third support ball, the third support ball extending partially above the top surface of the second body; and a fourth support ball retained in the fourth finger by a capture ring that is spaced from the fourth support ball, the fourth support ball extending partially above the top surface of the second body.

Example 11. The substrate support apparatus of Example 1, wherein the first body is a robot blade.

Example 12. The substrate support apparatus of Example 11, wherein the first body further comprises: a wrist having at least one mounting hole; a second support ball disposed in a second opening formed in the first body, the second support ball partially extending above the top surface, the second support ball spaced apart from a capture lip that retains the second support ball disposed in the second opening, the first and second support balls located at a distal end of the first body opposite the wrist; and a third support ball disposed in a third opening formed in the first body, the third support ball partially extending above the top surface, the third support ball spaced apart from a capture lip that retains the third support ball disposed in the third opening, the third support ball located proximate the wrist.

Example 13. The substrate support apparatus of Example 12, wherein the first body further comprises: a substrate receiving pocket.

Example 14. The substrate support apparatus of Example 1, wherein the top surface of the first body further comprises an indent disposed proximate the capture lip.

Example 15. The substrate support apparatus of Example 14, wherein the indent circumscribes the capture lip.

The foregoing description discloses only example embodiments. Modifications of the above-disclosed apparatus and methods which fall within the scope of this disclosure will be readily apparent to those of ordinary skill in the art.

What is claimed is:

1. A method for securing a support ball in a substrate support, the method comprising:

pressing a support ball into an opening formed in a first surface of the substrate support to a first depth, the substrate support configured to support a substrate in a vacuum processing chamber;

forming a capture lip in the opening, wherein the capture lip protrudes into the opening a distance sufficient to retain the support ball in the opening support ball, the capture lip formed between the first surface and a portion of the support ball in contact with the substrate support, the capture lip and the support ball disposed in a spaced apart relationship once the capture lip is formed; and setting an exposure height that the support ball projects above the first surface of the substrate support by pressing the support ball to a second depth within the opening that is greater than the first depth, a bottom of the opening and the support ball disposed in a spaced apart relationship once the exposure height is set.

2. The method of claim 1, wherein forming the capture lip further comprises:

displacing material from the substrate support into the opening in at least one or more locations along an edge of the opening.

3. The method of claim 1, wherein forming the capture lip further comprises:

displacing material from the substrate support into the opening to form a ring along an edge of the opening.

4. The method of claim 1, wherein pressing the support ball into the opening concurrently forms the captured lip.

5. The method of claim 1, wherein forming the capture lip concurrently sets the exposure height of the support.

6. The method of claim 1, wherein the support ball has an interference fit with the opening.

7. The method of claim 1, wherein setting the exposure height of the support ball spaces the support ball from the capture lip.

8. The method of claim 1, wherein setting the exposure height of the support ball spaces the support ball from the capture lip and a bottom of the opening.

9. The method of claim 1, wherein forming the capture lip further comprises deforming a top surface of the substrate support without contacting the support ball.

* * * * *